(12) United States Patent
Nakatani et al.

(10) Patent No.: US 7,018,705 B2
(45) Date of Patent: Mar. 28, 2006

(54) MULTILAYER CIRCUIT BOARD AND METHOD FOR MANUFACTURING THE SAME

(75) Inventors: Yasuhiro Nakatani, Kawachinagano (JP); Hideki Higashitani, Souraku-gun (JP); Tadashi Nakamura, Suita (JP); Fumio Echigo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/842,900

(22) Filed: May 10, 2004

(65) Prior Publication Data

US 2004/0231151 A1 Nov. 25, 2004

(30) Foreign Application Priority Data

May 20, 2003 (JP) .............................. 2003-142479

(51) Int. Cl.
  *B32B 3/00* (2006.01)
  *H01R 9/09* (2006.01)

(52) U.S. Cl. ...................... 428/209; 428/901; 174/250; 174/262; 174/264

(58) Field of Classification Search ................ 428/209, 428/901; 174/250, 262, 264
See application file for complete search history.

(56) References Cited

U.S. PATENT DOCUMENTS

| | | | |
|---|---|---|---|
| 3,902,951 A * | 9/1975 | Doi et al. ................... 156/313 |
| 5,346,750 A | 9/1994 | Hatakeyama et al. | |
| 6,197,407 B1 | 3/2001 | Andou et al. | |
| 6,224,965 B1 * | 5/2001 | Haas et al. ................. 428/209 |
| 6,337,037 B1 * | 1/2002 | St. John ..................... 252/514 |
| 6,391,460 B1 | 5/2002 | Tanaka et al. | |
| 6,459,046 B1 * | 10/2002 | Ochi et al. .................. 174/256 |
| 6,734,375 B1 * | 5/2004 | Kawakita et al. ........... 174/264 |
| 6,753,483 B1 * | 6/2004 | Andoh et al. ............... 174/262 |
| 6,799,369 B1 * | 10/2004 | Ochi et al. .................... 29/852 |

FOREIGN PATENT DOCUMENTS

JP 6-268345 9/1994
JP 8-148814 6/1996

* cited by examiner

*Primary Examiner*—Cathy F. Lam
(74) *Attorney, Agent, or Firm*—Hamre, Schumann, Mueller & Larson, P.C.

(57) ABSTRACT

It is an object of the present invention to provide a multilayer circuit board, and a method for manufacturing the same, in which a plurality of circuit boards are layered, wherein as regards at least one circuit board positioned on an outer side, a conductive substance is filled into holes passing through the circuit board in the thickness direction and cured, and the wiring layers of the plurality of circuit boards are electrically connected by the conductive substance that has been cured, wherein in the multilayer circuit board, the wiring layer positioned outside the conductive substance that has been cured projects outward from its surroundings. Thus, the conductive paste is sufficiently compressed during hot pressing to yield a stable electrical connection, and thermosetting resin can be filled in between the inner layer wiring pattern without leaving gaps.

5 Claims, 5 Drawing Sheets

MULTILAYER CIRCUIT BOARD AND METHOD FOR MANUFACTURING THE SAME

BACKGROUND OF THE INVENTION

1. Field of the Invention

The present invention relates to multilayer circuit boards in which the layers are electrically connected in the thickness direction of the circuit boards with a conductor such as conductive paste, and methods for manufacturing the same.

2. Description of the Related Art

As electrical devices have become more compact and more powerful in recent years a great need has developed to inexpensively supply industrial and consumer devices with multilayer wiring circuit boards on which semiconductor chips such as LSIs can be mounted at a high density. In such multilayer wiring circuit boards it is imperative that the plurality of layers of wiring patterns formed at a fine wiring pitch are electrically connected to one another with high reliability. In order to meet these market demands, any layer IVH structure resin multilayer circuit boards employing an inner-via hole connection method that allows interlayer connection of any electrode of a multilayer printed circuit board at any wiring pattern position have been proposed (see JP H6-268345A, for example) in place of metal plate conductors in the inner walls of through holes, which conventionally was the primary method for connecting layers in multilayer circuit boards. With such substrates, conductive paste is filled into the via holes of the multilayer printed circuit board to electrically connect only necessary layers, and because inner-via holes (IVH) can be provided directly below component lands, it is possible to achieve more compact substrates and higher density mounting. Moreover, since a conductive paste is used to achieve electrical connection in the inner-via holes, stress on the via holes can be eased and an electrical connection can be achieved that is stable even with respect to dimensional changes caused by heat or impact, for example.

Among any layer IVH structure resin multilayer circuit boards, circuit boards employing a paste fill method such as that shown in FIGS. 5A to 5D have been proposed conventionally for the purpose of achieving high-density interlayer connection with high productivity by reducing the size of the inner-via holes. A conventional method for manufacturing circuit boards that employs a paste fill method is described below. First, FIG. 5A shows an interlayer 106 in which wiring layers 102 are formed on both surfaces of an electrically insulating substrate 101 and these layers are connected by conductive paste 103 or through electrolytic plating. The electrically insulating substrate 101 is fabricated by impregnating both sides of a core material 104 with a thermosetting resin 105. The core material is a glass fabric impregnated with a thermosetting resin such as an epoxy resin, and typically a glass epoxy substrate is adopted as the substrate 101. FIG. 5B shows substrates A 110, in which a core material 107 is impregnated with an uncured thermosetting resin 108 and through holes are provided and filled with a conductive paste 109, disposed on either side of the inner layer substrate 106. The substrates A 110 disposed on either side of the inner layer substrate 106 are aligned at a predetermined position and temporarily fastened with an adhesive or the like (not shown in the drawing). Moreover, wiring layers 111 serving as outer layers are disposed at either side of the substrates A 110. Next, the uncured thermosetting resin 108 and the conductive paste 109 are cured by hot pressing, and the conductive paste 109 is compressed to adhere the wiring layer of the inner substrate and the outer layer wiring layers and achieving electrical connection between them, yielding the substrate shown in FIG. 5C. Then, the outer wiring layers are patterned by photolithography, resulting in the four-layer circuit board 112 shown in FIG. 5D. Reference numeral 111' denotes wiring that has been patterned.

With conventional methods for forming circuit boards such as the one described above, the conductive paste flows together with the resin during hot pressing if the extent to which the uncured thermosetting resin is cured is low (gel time, flowability of the resin, minimum viscosity value in the curing process, for example). As a result sufficient compression cannot be attained, and this causes connection defects. Alternatively, a high degree of curing leads to insufficient adherence with the inner layer substrate and causes whitening due to the resin not sufficiently flowing in between the wiring pattern of the inner layer, and defects result in the moisture absorption reflow test.

SUMMARY OF THE INVENTION

The present invention was arrived at to solve the above issues, and it is an object thereof to provide a multilayer circuit board, and a method for manufacturing the same, wherein the conductive paste is sufficiently compressed during hot pressing to yield a stable electrical connection, and the thermosetting resin can be filled in between the inner layer wiring pattern without leaving gaps.

A multilayer circuit board of the present invention is made of a plurality of layered circuit boards, wherein in at least one circuit board positioned on an outer side, a conductive substance is filled into holes passing through the circuit board in the thickness direction and cured, wiring layers of the plurality of circuit boards are electrically connected by the conductive substance that has been cured, and a wiring layer positioned on an outer side of the conductive substance that has been cured projects further outward than its surroundings.

A method for manufacturing a multilayer circuit board comprises disposing, on at least one surface of a circuit board including a wiring layer provided on either side of an electrically insulating substrate, an uncured substrate that includes a core material including an uncured thermosetting resin layer and an uncured thermosetting resin layer on either surface of the core material, and in which a conductive paste has been filled into holes that pass therethrough in the thickness direction, layering wiring layers from the outside, compressing the entire unit in the thickness direction to alter the shape of the uncured substrate along recesses and projections caused by wiring on the surface of adjacent circuit boards, and subsequently performing hot pressing to electrically connect the uncured substrate and the wiring layers of the adjacent circuit boards via a conductive substance obtained by thermally curing the conductive paste, causing the wiring layers positioned outside the conductive substance that has been cured to project outward from the surroundings.

DETAILED DESCRIPTION OF THE INVENTION

Figure 1A:
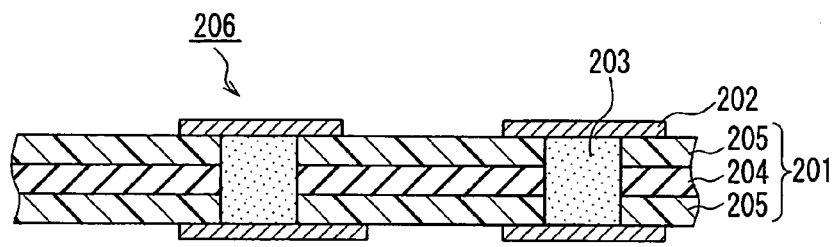
FIGS. 1A to 1C are cross-sectional diagrams describing the earlier half of a method for manufacturing a multilayer circuit board according to the first embodiment of the present invention.

A multilayer circuit board of the present invention is made of a plurality of layered circuit boards, wherein the wiring layer positioned outside the conductive substance that has been cured in at least one circuit board positioned on the outside projects further outward than its surroundings. This multilayer circuit board is obtained by disposing an uncured substrate that includes a core material including an uncured thermosetting resin layer and an uncured thermosetting resin layer on either surface of the core material, and in which a conductive paste has been filled into holes that pass therethrough in the thickness direction on at least one surface of a circuit board, layering wiring layers from the outside, compressing the entire unit in the thickness direction to alter the shape of the uncured substrate along recesses and projections caused by wiring on the surface of adjacent circuit boards, and subsequently performing hot pressing to electrically connect the uncured substrate and the wiring layers of the adjacent circuit boards via a conductive substance obtained by thermally curing the conductive paste.

Thus, it is possible to provide a multilayer circuit board, and a method for manufacturing the same, in which the conductive paste is sufficiently compressed during hot pressing to yield a stable electrical connection, and thermosetting resin can be filled in between the inner layer wiring pattern without leaving gaps.

Also, due to this structure in which the wiring layer projects outward, the strength of the junction between the via, which is made of a conductive material obtained by curing the conductive paste, and the wiring layer becomes high, and the via reliability can be increased. It also becomes easier to join other wiring layers from outside the wiring layer.

It is preferable that the height to which the wiring layers project outward is in a range of 1 μm to 100 μm.

It is preferable that the circuit boards whose wiring layer is projecting outward are constituted by a core material and a thermosetting resin layer on either side of the core material, and that the shape of the core material and the thermosetting resin layer on either side of the core material is altered along recesses and projections caused by wiring on the surface of an adjacent circuit board. This deformation allows resin to be filled in between the inner layer wiring pattern without leaving gaps.

It is possible that the recesses and projections of the core material and the thermosetting resin layer on either side of the core material are molded by pressure molding, compression molding, or vacuum molding, prior to hot pressing.

It is also preferable that three or more circuit boards are layered as the plurality of circuit boards, and that both circuit boards positioned at the outer layers are constituted by a core material and a thermosetting resin layer on either side of the core material.

It is also preferable that the core material is a resin film or a resin-impregnated fiber sheet.

The method for achieving both burying a thermosetting resin in between the inner layer wiring layer without leaving gaps and compressing the conductive paste according to the present invention is to dispose a press sheet, in which rigid sheets have been disposed on both sides of an uncured resin sheet, for which a thermosetting resin is employed, outside the outermost wiring layer at the time of hot pressing so that the viscosity of the press sheet drops as the temperature rises from room temperature and it follows the shape of the inner pattern of the resin sheet. Then, by further curing, the conductive paste can be compressed, and this allows the issues discussed above to be solved. With the present invention it is possible to obtain a multilayer circuit board that is capable of sufficiently withstanding the moisture absorption reflow test and that has high connection reliability. Moreover, it is also possible to achieve the same effects by disposing a composite press sheet, in which rigid sheets are disposed on either side of a thermoplastic sheet, outside the wiring layer when hot pressing. It is necessary, however, to adjust the relationship between the thermoplastic sheet and the rigid sheets taking into account the substrate. In other words, it is necessary to achieve a balance between the softness of the thermoplastic sheet and the elastic modulus (rigidity) of the rigid sheets. For example, if the thermoplastic sheet is significantly softened, then the elastic modulus of the rigid sheets can be raised or the rigid sheets can be made thick to give them rigidity. If they are made too rigid, however, then they interfere with the ability to bury the resin in the inner layer pattern, and this causes whitening.

When the electrically insulating material is a substrate in which a core material of fabric or non-woven fabric is impregnated with uncured resin or is a substrate in which uncured resin has been disposed on both sides of a core material constituted by an organic resin film sheet, then a method is adopted in which a press sheet whose elastic modulus is higher than that of the core material of the electrically insulating material and lower than that of the wiring layers is disposed outside the wiring layers when hot pressing.

Further, it is also possible to adopt a method where in a circuit board obtained by disposing, on either side of an inner layer substrate having wiring layers provided on both sides of an electrically insulating substrate, substrates in which conductive paste has been filled into holes that pass through an uncured electrically insulating substrate, and then stacking wiring layers on either side of these substrates and performing hot pressing to electrically connect the outermost layers and inner wiring layer via the conductive paste, substrates obtained by impregnating uncured resin in a core material and filling its through holes with a conductive paste are aligned on an inner layer substrate, and with outer layer wiring layers stacked on either side of these substrates, lamination is performed within a temperature range at which the thermosetting uncured resin is not completely cured, after which hot pressing is performed to cure the thermosetting resin and the conductive paste and achieve electrical connection.

Examples of ways in which lamination is performed include hot pressing with an elastic sheet having an elastic modulus that is lower than that of the core material disposed on either surface, and using a lamination device constituted by elastic rolls whose elastic modulus is lower than that of the core material. It is also effective to perform lamination under reduced pressure or in a vacuum.

Thus, due to the effect obtained by compressing the conductive paste, it is possible to achieve a multilayer circuit board having high electrical connection reliability, in which the problem of whitening due to wraparound defects of the resin has been eliminated, and which is capable of sufficiently withstanding the moisture absorption reflow test. Therefore, with the method for manufacturing a multilayer circuit board according to the present invention it is possible to increase the degree of softness (control range) of the uncured electrically insulating resin and to manufacture a multilayer circuit board having high electrical connection reliability without complicating the manufacturing process.

As discussed above, with the present invention it is possible to manufacture a product in which the thermosetting resin is deformed without leaving gaps in the inner layer wiring layer, and there is the effect that defects due to swelling can be eliminated in the moisture absorption reflow test. Further, the conductive paste and the wiring layers can be joined or alloyed by pressing using a material whose elastic modulus is higher than that of the core of the press sheet, which allows a stable electrical connection to be achieved. Moreover, using a thermosetting resin sheet or a composite sheet of a thermoplastic sheet and a resin sheet allows the multilayer circuit board to be fabricated without increasing the number of process steps. Further, by adopting a method that includes hot pressing with an elastic sheet or an elastic roll after packing the thermosetting resin in between the inner layer wiring pattern, it is possible to provide a method for manufacturing a multilayer circuit board that both solves the conventional issues and that takes productivity into consideration without using an indirect material such as a composite sheet. The inventions discussed above are preferably selected taking into account the number of products to be produced, the job size, and the physical properties of the thermosetting resin, for example. The above effects allow a significant reduction in defects caused by swelling when mounting components to the circuit boards and allow a multilayer circuit board with sufficiently high electrical connection reliability to be obtained.

First Embodiment

A method for manufacturing a multilayer circuit board according to a first embodiment of the present invention is described with reference to FIGS. 1A to 2B. FIG. 1A shows an inner layer substrate 206 in which wiring layers 202 are formed on both sides of an electrically insulating substrate 201 and these layers are connected by conductive paste 203 or electrolytic plating, for example. The electrically insulating substrate 201 is fabricated by impregnating both sides of a core material 204 with a thermosetting resin 205.

Figure 1B:
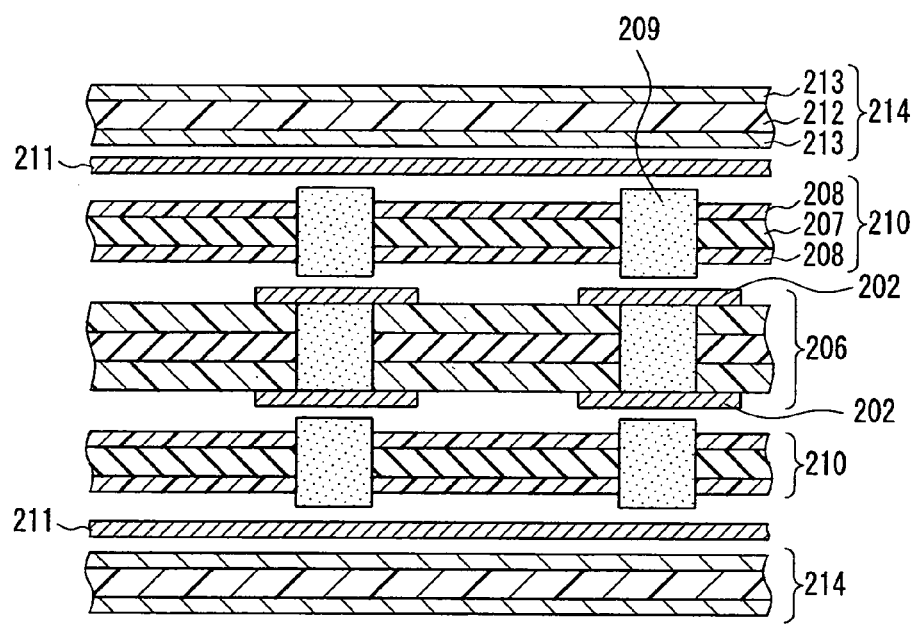

FIG. 1B shows substrates A 210 disposed on both sides of the inner layer substrate 206. The substrates A 210 are formed by adhering an uncured thermosetting resin 208 to a core material 207 and providing through holes into which a conductive paste 209 is filled. The core material is preferably a heat-resistant synthetic resin film such as a polyimide film, polyamide film, or a fluorine resin film (such as polytetrafluoroethylene) having a thickness in the range of 3 to 50 μm. The core material can also be made of a material such as prepreg obtained by impregnating a 10 to 200 μm thick aramid fiber non-woven fabric with epoxy resin.

The uncured thermosetting resin has a thickness in a range from 5 to 30 μm and preferably is made of a material such as polyimide based resin, epoxy based resin, or polyimide based resin into which epoxy groups have been introduced.

The substrates A 210 disposed on either side of the inner layer substrate 206 are aligned at a predetermined position and temporarily fastened with an adhesive or the like (not shown in the drawings). Outer layer wiring layers 211 are disposed outside each substrate A 210. Outside the outer layer wiring layers 211 are disposed composite press sheets 214 in which rigid sheets 213 are disposed on both sides of an uncured resin sheet 212 employing a thermosetting resin. An epoxy resin equivalent to FR-4 or FR-5 having a thickness in the range of 10 to 100 μm, for example, is used as the thermosetting resin, and the rigid sheets are for example copper foil, stainless steel foil, a fluorine-based resin sheet, or a polyimide film with a thickness in the range of 10 to 100 μm. However, one condition of the rigid sheet is that its elasticity modulus is higher than that of the material used for the core material. This is so that ultimately the core material also is compression molded.

Figure 1C:
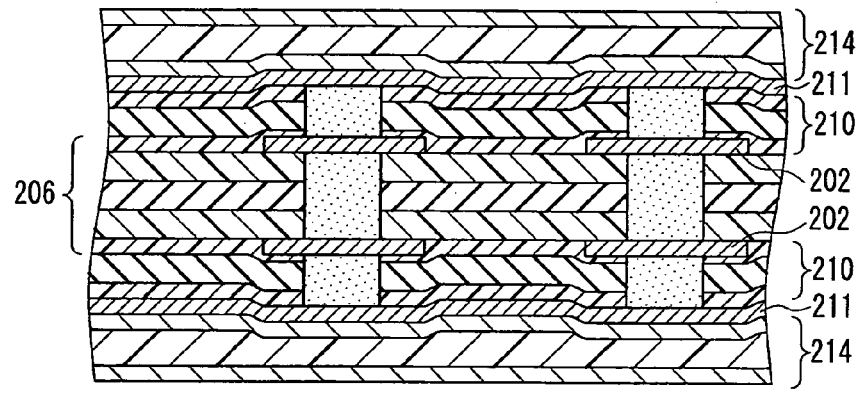

As shown in FIG. 1C, during the subsequent hot pressing, the viscosity of the resin sheet 212 drops as the temperature rises from room temperature under the increased pressure and the resin sheet 212 follows the shape of the pattern of the inner layer wiring layer. By further curing after this, the conductive paste can be compressed. As a result, the inner layer wiring layer 202 and the outer layer wiring layers 211 can be adhered to form a single unit, and sufficient electrical connection can be obtained. Also, since the resin sheet 212 follows the inner layer wiring pattern, the problem of whitening is inhibited, allowing a multilayer circuit board to be obtained in which defects do not occur in the moisture absorption reflow test. Regarding the preferable conditions for hot pressing, heat and pressure are applied at a press temperature of 200° C. and a pressure of 5 to 20 MPa for 60 minutes using a hot press.

Figure 2A:
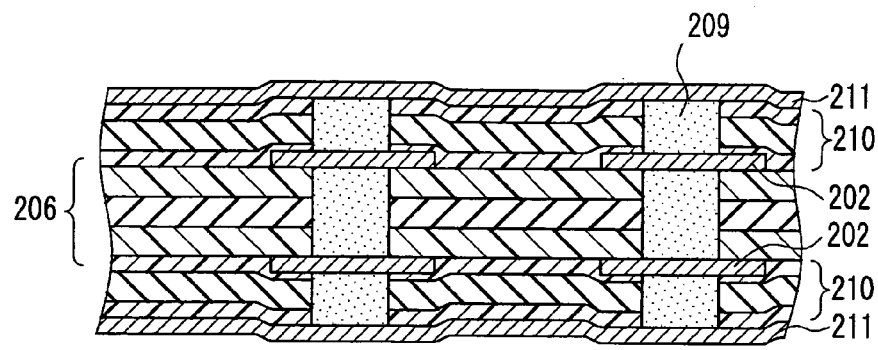
FIGS. 2A to 2B are cross-sectional diagrams describing the latter half of a method for manufacturing a multilayer circuit board according to the first embodiment of the present invention.
Figure 2B:
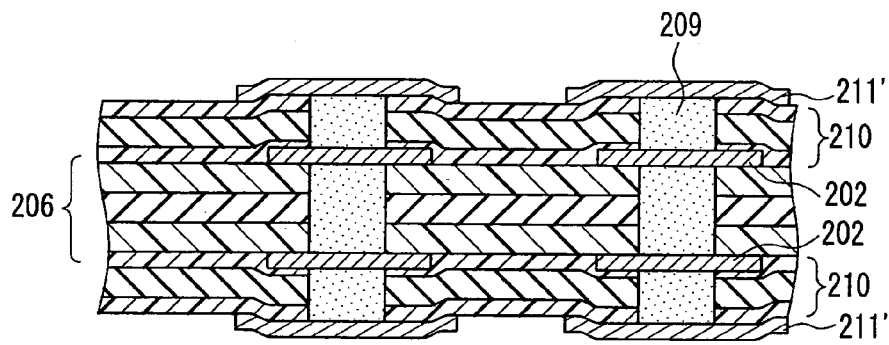

As shown in FIG. 2A, the substrate that is obtained after hot pressing is without gaps in the inner layer wiring pattern. Next, the outer layer wiring layers are patterned through photolithography to obtain the four-layer circuit board 215 shown in FIG. 2B. Reference numeral 211' denotes wiring that has been patterned. The wiring 211' projects out approximately 50 μm higher than its surroundings. The shape of the outer layer substrates 210 is altered and follows the recesses and projections of the inner layer wiring pattern 202.

If a thermoplastic sheet is used as the resin sheet 212, then it is necessary to take into account sufficiently the degree of softness with respect to the temperature of the sheet and the temperature during hot pressing. That is, when the degree of softness is high, the sheet becomes softer than the core material and pressure is lost toward the resin sheet, and as a result the conductive paste cannot be compressed sufficiently. Although to a certain extent this can be offset by the rigid sheet that is disposed on either side of the resin sheet, it remains necessary to give ample attention to this matter. To fully realize the effects of the present embodiment, the type and the thickness of the resin sheet must be taken into account so that the resin's ability to follow the inner layer pattern and the effect of compression on the conductive paste can be balanced. An example of a material that achieves this goal is a polytetrafluoroethylene (PTFE) sheet or other fluorine resin based sheets having a thickness in a range from 25 to 200 μm.

To balance the effects discussed above, it is also possible to dispose a press sheet material with a higher rigidity than that of the core material of the uncured electrically insulating material and lower than that of the wiring layer in place of the resin sheet 212 and the rigid sheets 213 outside the wiring layers during hot pressing. Examples of sheets that allow these effects to be achieved are metal sheets such as aluminum sheets and nickel sheets with a thickness in the range of 12 to 100 μm and resin sheets such as fluorine-based, PTFE-based, and polyimide-based resin sheets with a thickness in the range of 12 to 100 μm, and these may be constituted by a single sheet or a composite of several sheets. As the substrate A 210 it is possible to use a composite of a fabric or non-woven fabric organic or inorganic (such as glass) fiber as the core material and a thermosetting resin (such as an epoxy resin). The use of epoxy resin as the thermosetting resin is economically advantageous because epoxy resin is a widely available glass epoxy material. Further, the use of aramid fiber as the fiber and epoxy resin as the thermosetting resin allows for excellent laser workability and makes production easy. Moreover, when an organic resin film is used as the core material, the resulting multilayer circuit board is thin and flexible. As an organic resin film it is possible to use an aramid film, a polyimide film, or a liquid crystal polymer film, for example. Organic resin films easily can be obtained at a thickness of about 10 μm and allow a thin multilayer circuit board to be achieved. A thin organic resin film accordingly also allows the wiring to be connected through small via holes, and as a result it is possible to achieve a high-density multilayer circuit board.

The diameter of the via holes is preferably in the range of 30 to 70 μm, and more preferably in the vicinity of 50 μm, in the case of a 30 μm thick film.

Also, greater stability regarding reliability testing can be attained by using a thermosetting organic resin as an adhesive agent layer on both sides of the organic resin film.

Generally an electrolytic copper foil is used for the wiring layer and the conductive paste is made of at least a conductive powder and thermosetting resin. Examples of conductive powder include metal powders such as copper powder, silver powder, nickel powder, and aluminum powder, and powders coated by a layer of the above metals, and they can take the form of a resin, flakes, spheres, or an indeterminate form. Examples of thermosetting resins include publicly known resins such as phenol-based resin, naphthalene-based resin, urea resin, amino resin, alkyd resin, silicone resin, furan resin, unsaturated polyester resin, epoxy resin, and polyurethane resin, and these also may be suitably combined. It is also possible to add additives or a solvent in order to adjust the oxidation stability and the viscosity of the conductive paste. One method for providing the conductive paste with reducibility is to add a reducing agent or use an amine curing agent, but there is no limitation to these methods. Examples of reducing agents include publicly known reducing agents such as fatty acids, but there is no limitation to this.

If the wiring layer is formed by copper foil through hot pressing, then primarily mutual adherence occurs among the copper powder, and this permits electrical connection. When silver powder or particles of copper powder coated with silver are used, then alloying occurs in conjunction with adherence and allows a durable connection and high electrical connection to be obtained reliably.

Next, in the substrates A 210, the conductive paste 209 is formed to project from the thermosetting resin, and this is for the purpose of increasing the absolute quantity of particles so that connection is easily achieved by compressing the wiring layer and the conductive paste. Although not absolutely necessary, as disclosed in JP H06-268345A, this manufacturing method is easily obtained by providing holes under conditions where a cover film is disposed on the uncured resin and then filling the holes with conductive paste and stripping away the cover film.

With the present invention, the resin sheet 212 follows the inner layer wiring layer during hot pressing and thereby inhibits the occurrence of whitening and allows defects due to swelling in the moisture absorption reflow test to be eliminated. Moreover, with the present invention, the resin sheet 212 is hardened, and this allows compression of the conductive paste to be performed without adding additional steps, allowing a multilayer circuit board with high electrical connection reliability to be achieved.

Second Embodiment

Figure 3A:
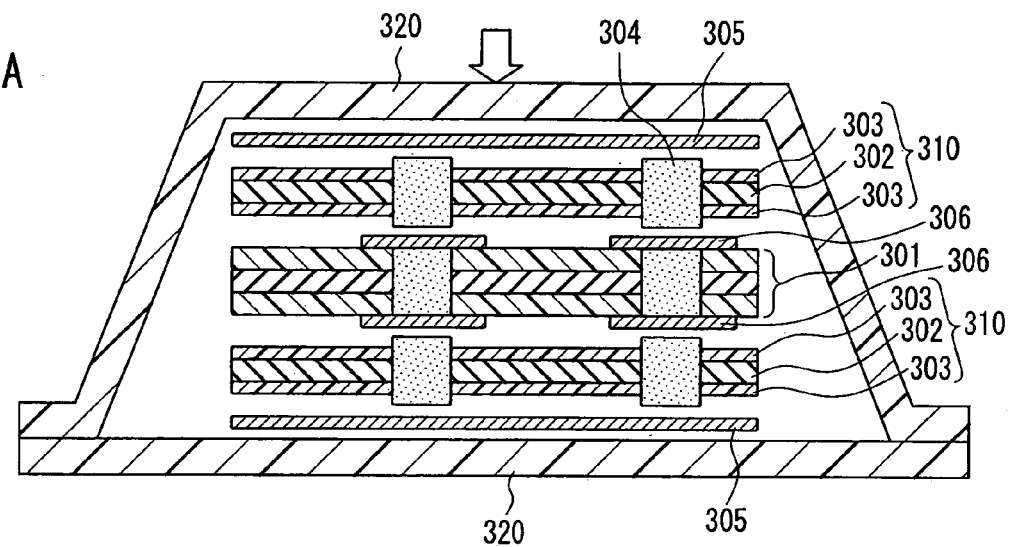
FIGS. 3A to 3C are cross-sectional diagrams describing a method for manufacturing a multilayer circuit board according to the second embodiment of the present invention.

The method for manufacturing a multilayer circuit board according to the second embodiment differs from that of the first embodiment discussed above in that it has a step of performing lamination with elastic sheets in a temperature range where the curable uncured resin is not completely cured, rather than using a composite sheet, when hot pressing, and a step of curing the electrically insulating substrate and the conductive paste and establishing electrical connection by hot pressing. The manufacturing method of the second embodiment is described below with reference to FIGS. 3A to 3C. FIG. 3A shows a plurality of substrates, which were fabricated as in FIG. 1B discussed above in the first embodiment, sandwiched between elastic sheets 320. As regards the plurality of substrates, substrates A310, which are obtained by impregnating both sides of a core material 302 with uncured thermosetting resin 303 and providing through holes into which conductive paste 304 is filled are disposed on either side of an inner layer substrate 301, and wiring layers 305 are disposed on either side of the substrates A310. Next, the elastic sheets 320 are pressed at a temperature at which the uncured thermosetting resin 303 is not completely cured, laminating the elastic sheets 320. As the elastic sheets it is possible to use aluminum foil, nickel foil, a fluorine resin film, a silicone rubber sheet, a fluorine rubber sheet, or a urethane rubber sheet, for example, with a thickness in the range of 12 to 100 μm.

Figure 3B:
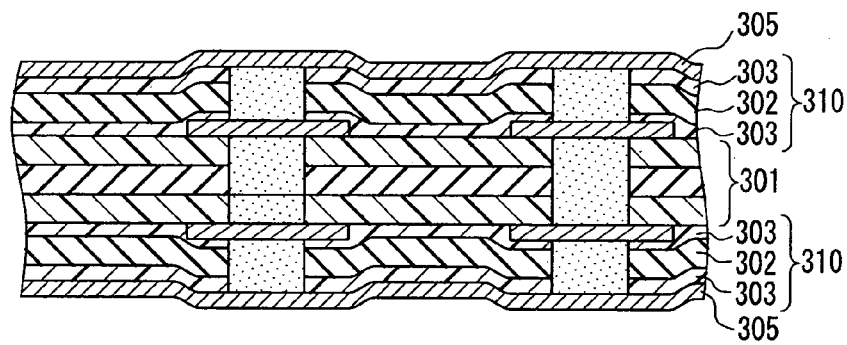

FIG. 3B is a sectional view showing the state after lamination. As shown in this drawing, the thermosetting resin 303 is pressed against the elastic sheets 320 and permeates in between the inner layer pattern. At this time the conductive paste 304 is only closely adhered to the wiring layers on both sides and is hardly connected at all. Further, curing of the uncured thermosetting resin 303 has hardly progressed at all. If the temperature is high when this is performed, then the resin does not flow into the remaining gaps even though hot pressing is later performed, and the conductive paste cannot be sufficiently compressed, and thus electrical connection cannot be obtained.

Next, hot pressing is performed to cure the thermosetting resin 303 and the conductive paste 304 and compress the conductive paste, obtaining electrical connection. At this time, resin is filled in between gaps in the inner layer wiring layer that had occurred at the point of FIG. 3A. Regarding the preferable conditions for hot pressing, heat and pressure are applied at a press temperature of 200° C. and a pressure of 5 to 20 MPa for 60 minutes using a hot press.

Figure 3C:
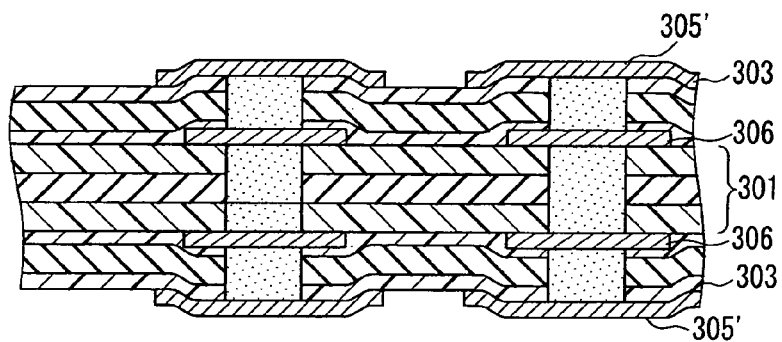

Next, as shown in FIG. 3C, the outer layer wiring layers are patterned through photolithography, obtaining a four-layer circuit board. Reference numeral 305' denotes wiring that has been patterned. The wiring 305' projects outward approximately 50 μm higher than its surroundings. The shape of the thermosetting resin 303 has been altered and follows the recesses and projections of the inner layer wiring pattern 306.

Third Embodiment

Figure 4A:
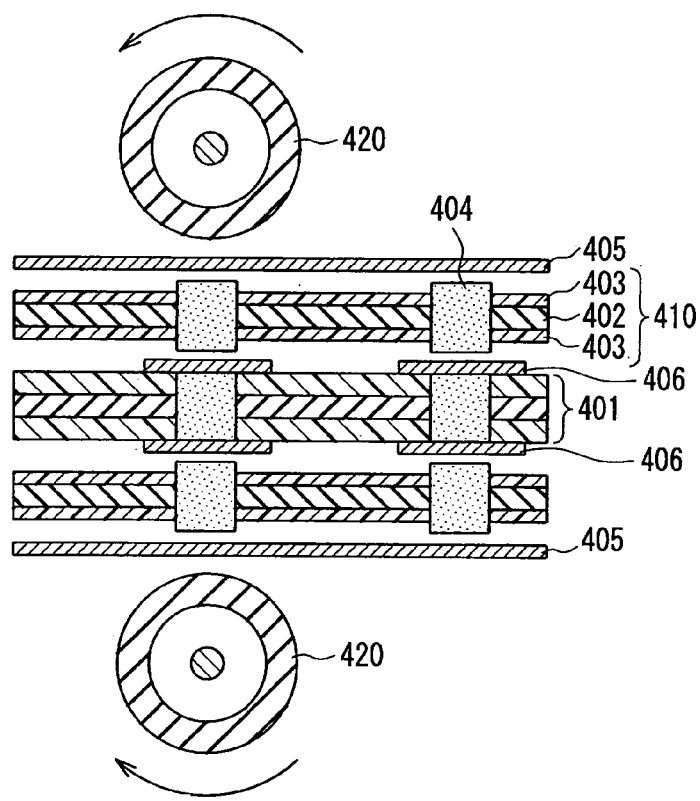
FIGS. 4A to 4C are cross-sectional diagrams describing a method for manufacturing a multilayer circuit board according to the third embodiment of the present invention.

The method for manufacturing a multilayer circuit board according to the third embodiment differs from that of the first embodiment and the second embodiment discussed above in that it has a step of performing lamination with elastic rolls in a temperature range where a curable uncured resin is not completely cured, rather than using a composite sheet, when hot pressing, and a step of curing the electrically insulating substrate and the conductive paste and establishing electrical connection by hot pressing. The manufacturing method of the third embodiment is described below with reference to FIGS. 4A to 4C. FIG. 4A shows a plurality of substrates fabricated as in FIG. 1B discussed above in the first embodiment sandwiched between elastic rolls 420. Silicone rubber or urethane rubber rolls, for example, can be used as the elastic rolls 420.

Figure 4B:
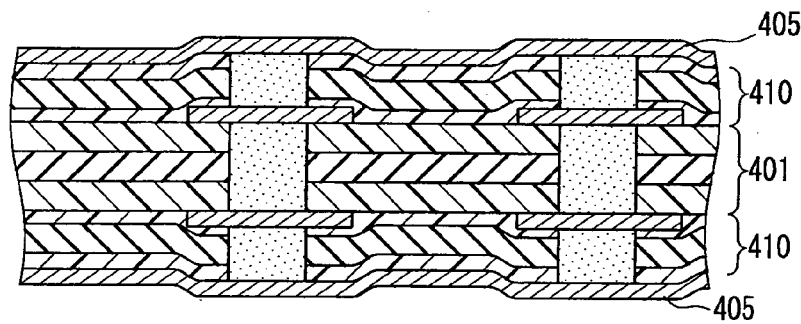

Regarding the plurality of substrates, substrates A410 obtained by impregnating both sides of a core material 402 with uncured thermosetting resin 403 and providing through holes into which conductive paste 404 is filled are disposed on either side of an inner layer substrate 401, and wiring layers 405 are disposed on either side of the substrates A410. Next, lamination is performed using the elastic rolls 420 at a temperature at which the uncured thermosetting resin 403 is not completely cured. The preferable conditions for lamination are a temperature of from 70 to 120° C., a line pressure of 0.1 to 0.3 kg/cm, and a roll travel velocity of 30 mm per minute. FIG. 4B is a cross-sectional view showing the state after lamination, and as shown in this drawing, the uncured thermosetting resin 403 is pressed by the elastic rolls 420 and permeates in between the inner layer pattern. At this time the conductive paste 404 is only closely adhered to the wiring layers on both sides and is hardly connected at all. Further, curing of the uncured thermosetting resin 403 has hardly progressed at all. When the temperature is increased at this time, then the resin does not flow into the remaining gaps even though hot pressing is subsequently performed, and the conductive paste cannot be sufficiently compressed, and thus electrical connection cannot be obtained. This is the same as in the second embodiment. Next, hot pressing is performed to cure the thermosetting resin 403 and the conductive paste 404 and compress the conductive paste, obtaining electrical connection. At this time, resin is filled in between gaps in the inner layer wiring layer that have been formed at the point of FIG. 4A.

Figure 4C:
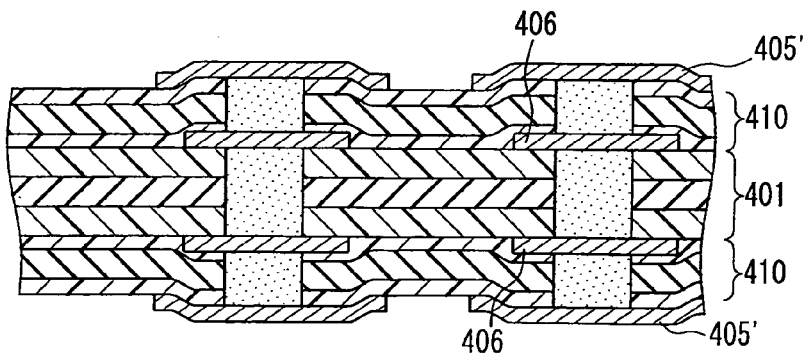
Figure 5A:
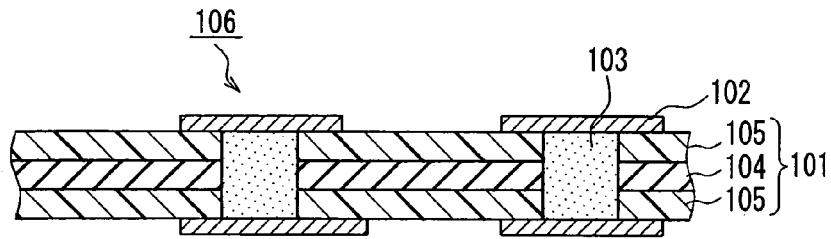
FIGS. 5A to 5D are cross-sectional diagrams describing a method for manufacturing a multilayer circuit board according to a conventional embodiment.
Figure 5B:
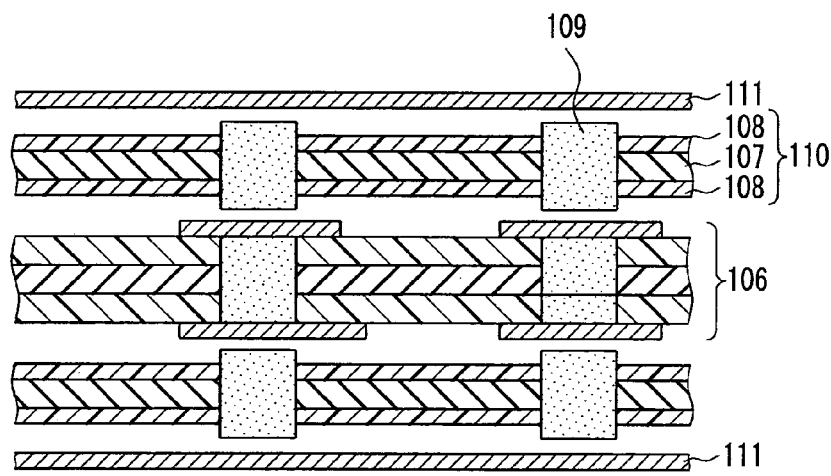
Figure 5C:
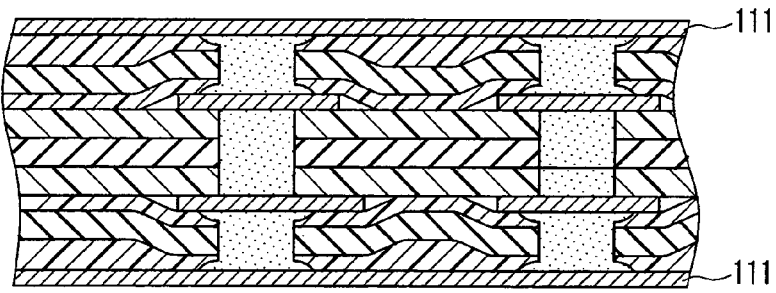
Figure 5D:
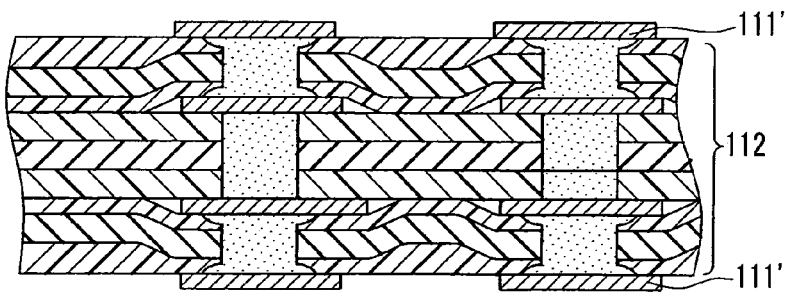

Next, as shown in FIG. 4C, the outer layer wiring layers are patterned through photolithography, obtaining a four-layer circuit board. Reference numeral 405' denotes wiring that has been patterned. The wiring 405' projects out approximately 50 μm higher than its surroundings. The shape of the outer layer substrates 410 has been altered and follows the recesses and projections of the inner layer wiring pattern 406.

With this embodiment, lamination is performed using the elastic rolls and therefore the task of lamination can be performed continuously, allowing greater productivity than with the second embodiment. Moreover, this embodiment does not require indirect materials such as a composite sheet, and thus the multilayer circuit board can be obtained at lower costs than in the first embodiment.

With the multilayer circuit board of the present embodiment fabricated through a manufacturing method such as that above, the problem of whitening due to insufficient flow of the thermosetting resin can be inhibited more than in multilayer circuit boards fabricated through conventional manufacturing methods, and it is possible to achieve a manufactured product in which the electrical connection due to the conductive paste is as stable as in conventional products.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A multilayer circuit board made of a plurality of layered circuit boards, wherein in at least one circuit board positioned on an outer side, a conductive substance is filled into holes passing through the circuit board in thickness direction and cured, and wiring layers of the plurality of circuit boards are electrically connected by the conductive substance that has been cured, and wherein a wiring layer positioned on an outer side of the conductive substance that has been cured projects further outward than its surroundings, and wherein a height to which the wiring layers project outward is in a range of 1 μm to 100 μm.

2. The multilayer circuit board according to claim 1, wherein the circuit board whose wiring layer is projecting outward is made of a core material and a thermosetting resin layer on either side of the core material; and wherein a shape of the core material and the thermosetting resin layer on either side of the core material is altered along recesses and projections caused by wiring on the surface of an adjacent circuit board.

3. The multilayer circuit board according to claim 2, wherein the recesses and projections of the core material and the thermosetting resin layer on either side of the core material are molded by pressure molding, compression molding, or vacuum molding, prior to hot pressing.

4. The multilayer circuit board according to claim 1, wherein three or more circuit boards are layered as the plurality of circuit boards; and wherein both circuit boards positioned at the outer layers are made of a core material and a thermosetting resin layer on either side of the core material.

5. The multilayer circuit board according to claim 1, wherein the core material is a resin film or a resin-impregnated fiber sheet.

* * * * *